United States Patent [19]

Kurosawa et al.

[11] Patent Number: 5,260,264
[45] Date of Patent: Nov. 9, 1993

[54] JOSEPHSON MEMORY CIRCUIT

[75] Inventors: Itaru Kurosawa, Tsukuba; Hiroshi Nakagawa, Ushiku; Masahiro Aoyagi, Tsukuba, all of Japan

[73] Assignees: Agency of Industrial Science & Technology; Ministry of International Trade & Industry, both of Tokyo, Japan

[21] Appl. No.: 663,456

[22] Filed: Mar. 4, 1991

[30] Foreign Application Priority Data

Mar. 26, 1990 [JP] Japan .................... 2-76260

[51] Int. Cl.⁵ .................... H01B 12/00; H01L 39/12
[52] U.S. Cl. .......................... 505/1; 505/702; 505/832; 505/874; 257/31; 257/33; 257/36; 365/162
[58] Field of Search ............. 357/5; 365/162; 505/702, 832, 874, 1; 257/31, 33, 36, 661, 663

[56] References Cited

U.S. PATENT DOCUMENTS

| | | | |
|---|---|---|---|
| 4,130,893 | 12/1978 | Henkels | 365/162 |
| 4,509,146 | 4/1985 | Wang et al. | 365/162 |
| 4,974,205 | 11/1990 | Kotani | 365/162 |
| 5,051,627 | 9/1991 | Schneier et al. | 307/476 |

FOREIGN PATENT DOCUMENTS

| | | | |
|---|---|---|---|
| 0366530 | 5/1990 | European Pat. Off. | 365/162 |
| 0063799 | 4/1985 | Japan | 365/162 |
| 1-21600 | 6/1985 | Japan | 365/162 |
| 2-85798 | 11/1988 | Japan | 365/162 |

Primary Examiner—Rolf Hille
Assistant Examiner—David Ostrowski
Attorney, Agent, or Firm—Oblon, Spivak, McClelland, Maier & Neustadt

[57] ABSTRACT

One or more superconducting memory cells capable of storing binary values as the presence or absence of a persisting loop current in their superconducting memory loops are connected in series by a circuit current line. This arrangement is provided with a set gate which switches to the voltage state and outputs circuit current from its output terminal to one end of the circuit current line when write command current is supplied to its control terminal and is further provided with a sense gate whose control terminal is series coupled though a capacitance element with the same one end of the circuit current line and whose ground side terminal is connected with the other end of the circuit control line thereby forming through the sense gate a read-out loop for receiving as differential current persisting loop current selectively discharged from the memory loop. The differential current causes the sense gate to switch itself to the voltage state and output a sense current. At least a part of the sense current is supplied to the control terminal of the set gate as rewrite command current. As a result, the read-out of binary values from the superconducting memory loop can be conducted in a manner that is equivalent to nondestructive read-out. As the differential current dissipates automatically over a period of time determined by a prescribed time constant, there remains no residual current which might cause an operational error.

11 Claims, 4 Drawing Sheets

PRIOR ART

JOSEPHSON MEMORY CIRCUIT

BACKGROUND OF THE INVENTION

1. Field of the Invention

This invention relates to a Josephson memory circuit which stores binary information as the presence or absence of at least one flux quantum captured in its superconducting memory loop and more particularly to such a Josephson memory circuit which enables the equivalent of nondestructive read-out to be conducted simply and reliably.

2. Prior Art Statement

Figure 3:
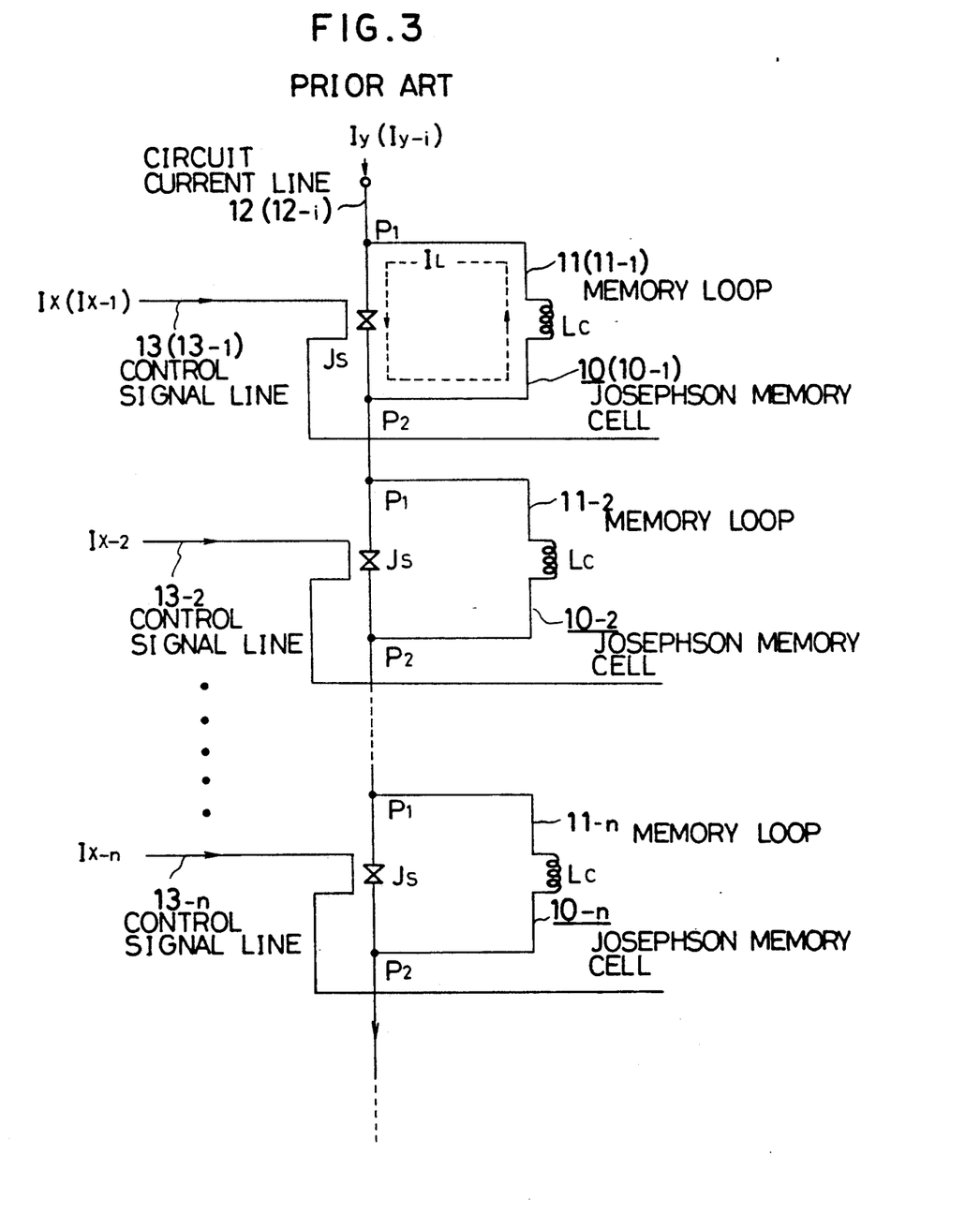
FIG. 3 is a schematic view of a typical Josephson memory cell column.

FIG. 3 shows an example of a typical conventional Josephson memory circuit of the type which represents the binary values "1" and "0" in terms of whether or not at least one flux quantum is captured in its superconducting loop, namely, in terms of whether or not a persisting loop current is flowing therein. This circuit consists basically of a plurality of Josephson cells $10_{-1}$–$10_{-n}$ constituted as ac-superconducting quantum interference devices (ac-SQUIDs) and connected in series as a column of memory cells by a single circuit current line 12. Generally, a plurality of such memory cell columns are disposed in the row direction so as to form a memory space constituted as an ordinary X-Y matrix. For indicating that there are a plurality of current lines 12 interconnecting the respective memory cell columns, the notation in the same figure is followed by ($12_{-i}$), where i=1, 2, 3 ...

Each of the Josephson memory cells 10 has a superconducting memory loop 11 for capturing a prescribed number of flux quanta. The superconducting memory loop 11 has therein at least one Josephson switch $J_S$ whose critical current value is controlled by means of an external control current $I_X$ applied to a magnetically coupled control signal line 13 and a pair of current injection terminals $P_1$, $P_2$ for connecting the superconducting memory loop 11 in series with the circuit current line 12.

Depending on the moment-to-moment operating state of the cell, one of the current injection terminals $P_1$, $P_2$ is n the current inflow side and the other is on the current outflow side. From the viewpoint of either of the current injection terminals $P_1$, $P_2$, the superconducting memory loop 11 can be seen as being constituted of left and right branches. In the illustrated example, the Josephson switch $J_S$ is included in series connection within the left branch and an inductance $L_C$ is included in series connection within the right branch. While the left branch also includes an inductance component, it is generally advantageous to establish a large difference between the inductance components of the two branches and, therefore, it is a common practice to ignore the inductance component of the branch including the Josephson switch $J_S$ when representing a memory circuit of this type schematically. The drawing thus deliberately shows only the inductance $L_C$ (which is of not less than a prescribed value) as being concentrated at one location.

Where an X-Y matrix is to be constituted in the manner described above to serve as a Josephson memory circuit, it is possible to have the control currents $I_X$ for controlling the Josephson switches $J_S$ of the individual superconducting memory loops 11 within the memory cell column double as, for example, the X selection (row selection or word selection) currents. In the drawing, therefore, the control currents $I_X$ are assigned parenthetical row number suffixes $I_{X-1}$, $I_{X-2}$, ..., $I_{X-n}$ and the control signal lines 13 are assigned corresponding suffixes.

In the ensuing description, however, the suffixes of symbols designating the respective circuit elements and currents will be omitted unless they are necessary for indicating a specific column or row or for distinguishing between different columns and rows.

There will now be described a typical example of the operation conducted when a binary value is to be written to a specific address (i.e. to a specific memory cell $10_{-ji}$, where j=1, 2, ..., n). (For the purpose of the description, binary "1" is defined to be represented by the state in which a prescribed number of flux quanta are captured in the superconducting memory loop 11, specifically by the state in which a persisting loop current $I_L$ is present.)

Say, for example, that binary "1" is to be written to Josephson memory cell $10_{-i}$. In this case, a control current $I_{X-i}$ of a significant value other than zero is applied as the row selection current and the circuit current $I_{Y-i}$ is similarly made to assume a significant value other than zero. In contrast, when binary "0" is to be written, only the control current $I_{X-i}$ is increased to a significant value while the circuit current $I_{Y-i}$ is maintained at zero (is not applied). Then after the lapse of a period of time preset for the write mode, the control current $I_{X-i}$ is returned to zero, whereafter the circuit current $I_{Y-i}$ is returned to zero (unless the operation was for writing binary "0", in which case it is already at zero). The operation for writing binary "1" causes a prescribed number of flux quanta to be captured by the superconducting memory loop $11_{-i}$ of the Josephson memory cell $10_{-i}$, with the result that a persisting loop current $I_L$ is established as indicated by the broken line in FIG. 3. On the other hand, no significant current is present in the superconducting memory loop $11_{-i}$ following the writing of binary "0".

Although the specific arrangement of the switching gates and other peripheral circuits conventionally employed for selectively switching the circuit current $I_Y$ and the control current $I_X$ during the binary value writing operation may vary somewhat in structure, they are by and large substantially identical in principle. In contrast, the fact that nondestructive reading of the binary values stored in the cells requires some special technique has led to the development of various methods for this purpose.

Figure 4:
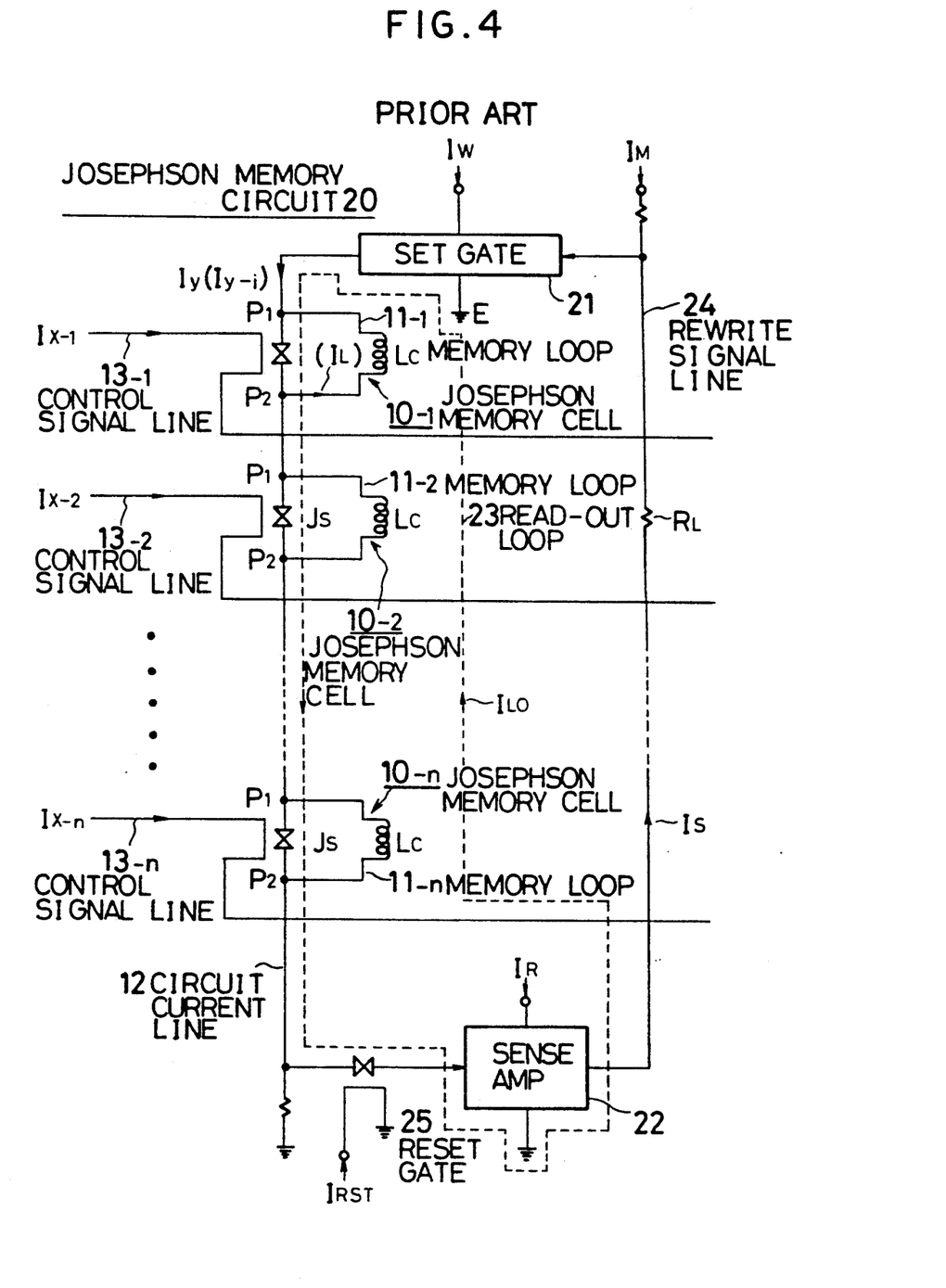
FIG. 4 is a partial schematic view showing the unit memory cell column used in a conventional Josephson memory circuit capable of performing the equivalent of nondestructive read-out and considered to be one of the best conventional circuits of its type.

Among these, one exhibiting numerous advantages over other methods is disclosed in the applicant's Japanese Patent Public Disclosure 63(1988)-285798, according to which nondestructive reading is achieved by using the sense current which flows at the time of reading binary "1" both as sense current and also for rewriting binary "1" to the memory cell with respect to which the reading was conducted. FIG. 4 shows a specific example of a circuit for conducting nondestructive read-out according to the teaching of this earlier invention. In the illustrated circuit, one end of a memory cell column, which can be of substantially the same structure as that shown in FIG. 3, specifically one end of the circuit current line 12 interconnecting the memory cells of the column, is connected with a set gate 21, while the other end thereof is connected with a sense gate 22 via a reset gate 25. Since the sense gate 22 is generally one having a gain factor, it is frequently referred to as a sense amplifier and is so indicated in the drawing.

Under application of current $I_W$ from the power source, the voltage state of the set gate 21 switches over when its control input terminal receives a binary "1" write command current $I_M$ or, as will be explained later, receives an output current (sense current) $I_S$ from the sense amplifier 22. On the other hand, under the application of current $I_R$ from the power source, the sense amplifier 22 switches its voltage state when its control terminal receives a read current $I_{LO}$ (to be explained later) and, upon switching over, outputs the current $I_S$ to the load impedance $R_L$ at a prescribed gain. On the other hand, when the control currents $I_M$, $I_S$, $I_{LO}$ are not being applied, the gates 21, 22 maintain a zero voltage state even if the power source current $I_W$ or $I_R$ is applied thereto and both their inputs and outputs are dropped to ground potential (as indicated by the symbol E next to set gate 21).

In such state, therefore, one end of the circuit current line 12 is connected with ground E through the output of the set gate 21 and the superconducting path (not shown) within the set gate 21, while the other end thereof is connected with ground E through the reset gate 25 and the superconducting path (not shown) within the sense amplifier 22. The circuit board of this type of Josephson memory circuit generally has a ground plane thereon for constituting the ground E. Insofar as the reset gate 25 also maintains its zero voltage state, therefore, a single large superconducting loop 23 (indicated by a broken line in the drawing) is formed. As will be understood from the explanation later in this specification, this loop 23 can be thought of as a "binary '1' read loop" or a "current discharge loop."

The operation of the conventional Josephson memory circuit 20 shown in FIG. 4 will now be explained.

The write operation is substantially the same as that explained earlier with respect to FIG. 3. Specifically, for writing binary "1" into the selected superconducting memory loop, control current $I_X$ is applied as the X selection current and binary "1" command current $I_M$ is applied to the control input of the set gate 21 so as to switch over the voltage state of the set gate 21 and cause circuit current $I_Y$ to flow into the circuit current line 12. For writing binary "0", on the other hand, only control current $I_X$ is applied, without applying binary "1" write command current $I_M$ to the set gate 21. In the latter case, while the state of the selected superconducting memory loop prior to the write operation may in some cases be binary "1", this creates no problem since the application of only the control current $I_X$ operates in conjunction with the persisting loop current $I_L$ flowing within the superconducting memory loop 11 to produce an effect which once switches the Josephson switch $J_S$ to the voltage state so as to discharge the persisting loop current $I_L$. In the conventional Josephson memory circuit 20, however, the current state within the read loop 23 may in some cases become indefinite. This is particularly true following a binary "1" write operation or a binary "1" nondestructive read operation of the type to be explained later and necessitates an operation for reliably discharging from the circuit current line 12 any residual current component that may be present. Thus, prior to the initiation of either the write mode or the read mode, it is necessary to apply a reset current $I_{RST}$ to the reset gate 25 so as to put loop 23 in the voltage state for a predetermined time period so as to momentarily discharge it.

On the other hand, in the mode for nondestructively reading the information stored in the selected superconducting memory loop 11 (or Josephson memory cell 10), the operation begins with the application of the power source current $I_W$ to the set gate 21 and the power source current $I_R$ to the sense amplifier 22. The power source current $I_R$ can be thought of as a read mode current for informing the external circuitry that the operation is in read mode.

After this state has been established, control current $I_X$ is applied to the control signal line 13 of the selected superconducting memory loop 11. If the binary value stored in the selected superconducting memory loop 11 is "0", since this means that there will be no discharge of persisting loop current $I_L$ to the read loop 23, the sense amplifier 22 will maintain its zero voltage state notwithstanding that read mode current $I_R$ is being applied thereto as circuit current. Therefore, since no significant current will pass through the load resistance $R_L$ on the output side of the sense amplifier 22, the external circuitry (not shown) will be able to detect from this fact that the value stored in the selected Josephson memory cell 10 is binary "0".

On the other hand, if the binary value stored in the selected superconducting memory loop 11 or Josephson memory cell 10 is "1", the control current $I_X$ applied to the Josephson switch $J_S$ of the cell 10 concerned will operate in conjunction with the persisting loop current $I_L$ flowing within the superconducting memory loop 11 of the cell to produce an effect causing the Josephson switch $J_S$ of the superconducting memory loop 11 concerned to switch temporarily to the voltage state, whereby discharge current $I_{LO}$ will pass into the read loop 23 from the superconducting memory loop 11. Then, since the read mode current $I_R$ is applied to the sense amplifier 22 during this read mode operation, the sense amplifier 22 will be switched to the voltage state upon receipt of the discharge current $I_{LO}$, whereby the sense amplifier 22 will output sense current $I_S$ representing binary "1" to the load resistance $R_L$.

If this were all there were to the binary "1" read operation, the read-out would be destructive. As soon as the operations explained so far have been completed, however, the conventional circuit shown in FIG. 4 carries out a rewrite operation so as to produce an effect that is equivalent to nondestructive read-out. Specifically, when the sense amplifier 22 switches to the voltage state and outputs the sense current $I_S$ to the load resistance $R_L$, the sense current $I_S$ is forwarded through a rewrite signal line 24 to the input of the set gate 21, which is at this time being supplied with the power source current $I_W$. As a result, the control input of the set gate 21 receives a rewrite command current that is functionally identical to the binary "1" command current mentioned earlier. Thus, by the same mechanism as described above, the set gate 21 switches to the voltage state, causing circuit current $I_Y$ to flow into the circuit current line 12 at this time. Since control current $I_X$ for read-out is still being supplied to the selected Josephson memory cell 10 when this occurs, the combined action of the two currents causes binary "1" to be rewritten to the superconducting memory loop of the Josephson memory cell 10. The result is thus the equivalent of nondestructive read-out.

Earlier methods for achieving nondestructive read-out included highly complicated ones requiring a dedicated sense gate for every memory cell and ones using three operating states based on the number of flux quanta (two, one or zero, for example) captured by the superconducting memory loop and were deficient both in ability to adapt to different operating conditions and in degree of design freedom. While the nondestructive read-out principle embodied by the circuit shown in FIG. 4 and explained in the foregoing is far superior to that of these earlier circuits, it still has room for improvement. For instance, one disadvantage that can be pointed out is the intrinsic need in the case of the arrangement shown in FIG. 4 to dispose a set gate 21 and a sense amplifier 22 separately at opposite ends of the respective circuit current lines 12. The long rewrite signal line 24 required for supplying the rewrite command current $I_S$ from the sense amplifier 22 to the set gate 21 in this arrangement is disadvantageous from the point of slowing the operating speed of the memory circuit but is even a greater problem as a factor increasing structural complexity, reducing packing density and decreasing the degree of freedom of memory cell and memory column layout when the memory circuit is to be integrated on a single chip. While it is not impossible to devise a circuit layout that brings the set gate 21 and the sense amplifier 22 close together on the IC substrate, this can be achieved only at the expense of increasing the length of the control input line extending from the opposite end of the circuit current line 12 through the reset gate 25 to the sense amplifier 22 and, therefore, is not a solution capable of overcoming the various problems discussed above.

Another shortcoming of the conventional Josephson memory circuit 20 shown in FIG. 4 is that the need touched on briefly earlier to eliminate the indefinite current state that can be expected to arise in the superconducting read-out loop 23 after a binary "1" write or nondestructive read operation makes the reset gate 25 a substantially indispensable circuit element. From the point of circuit simplification and the realization of a higher degree of integration, however, it would be preferable to do away with this reset gate provided only to mitigate a negative aspect of the circuit. It would be even more preferable to provide a fundamental solution by altogether eliminating the occurrence of the indefinite current state that makes the gate necessary in the first place. In addition to such circuit and integration density related problems, the conventional Josephson memory circuit 20 has a further drawback in that a special timing arrangement is required solely for the reset gate 25. Specifically, it is necessary to provide a dedicated power source (generally a unipolar pulse source) for supplying the reset current $I_{RST}$. As was reported in newspapers throughout Japan on Dec. 13, 1989, the present assignee was the first anywhere in the world to carry out successful test operation of a Josephson computer. This has helped to convince the assignee that Josephson circuits of the type under discussion here can be expected to develop at a rapid ace, and from this it can easily be anticipated that the different types of timing required in such circuits will become extremely numerous. The assignee thus desires to contribute to reducing the number of different types of timing required, even if only by one.

The earlier mentioned Japanese patent public disclosure describing the memory circuit indicated in FIG. 4 states that as the means for eliminating the residual current it is possible, in lieu of providing the reset gate 25, simply to provide a resistor in series within the superconducting read-out loop 23 so that the residual current can be dissipated by conversion to heat. As, however, such a resistor would also constitute a cause for loss of the regular discharge current from the superconducting memory loop 11, the reset gate becomes necessary at the practical application level.

OBJECT AND SUMMARY OF THE INVENTION

The present invention was accomplished in the light of the foregoing situation and has as its object the provision of a Josephson memory circuit which enables nondestructive read-out from the memory cells of the memory column, overcomes the above-mentioned shortcomings of the Josephson memory circuit 20 shown in FIG. 4 and considered to be the best of its type heretofore, and enables the wiring between the set gate and the sense amplifier to be shortened without giving rise to an indefinite current state.

For realizing this object, the present invention provides an improvement on the memory cell column of the earlier described structure shown in FIG. 3, namely on a memory cell column comprising one or more superconducting memory cells each having a superconducting memory loop including a pair of current injection terminals, at least one Josephson switch provided in the superconducting memory loop whose critical current value is controllable by an external control current for selectively switching it between a zero voltage state in which the superconducting memory loop is closed and a voltage state in which the superconducting memory loop is open and a control signal line for passage of the control current, the superconducting memory cells storing binary values in the form of the presence or absence of a persisting loop current flowing in the superconducting memory loop and being connected in series through the current injection terminals of the superconducting memory loops by a circuit current line.

The improvement comprises the provision of additional circuit elements in this conventional circuit. The first of these is a set gate which upon application to a control terminal thereof of a write command current indicative of the binary value represented by the presence of a persisting loop current in the memory loop switches its voltage state and from an output terminal thereof outputs a circuit current to one end of the circuit current line 12. Further, the control terminal of a sense gate is series coupled through a capacitance element with the end of the circuit current line connected with the output terminal of the set gate. As the sense gate there is used one that operates upon receiving a negative control input. That is to say, there is selected as the sense gate one capable of being switched from the zero voltage state to the voltage state by a current entering from its ground side terminal, passing through its internal superconducting path and exiting from its control terminal. The selected sense gate should preferably be one of the so-called sense amplifier type providing a prescribed degree of current gain. As an appropriate and simple negative-input sense gate of this type there can be used one based on the known SQUID (superconducting quantum interference device) gate structure. In addition, the arrangement is such that the other end of the circuit current line (the end not connected with the set gate and the sense gate) is electrically connected with the ground side terminal of the sense gate so that during the time when the negative-input sense gate is in the zero voltage state the circuit current line is shorted through a current path including the series circuit segment constituted by the capacitance element and the superconducting path in the sense gate. In this way there is constituted a read-out loop which is able to receive the discharge current produced at the time the persisting loop current is selectively discharged from the memory loop as differential current. In this type of Josephson memory circuit, a ground plane establishing a reference potential (ground potential) is generally formed on the device substrate. In accordance with one aspect of the present invention, this ground plane is employed for establishing at least a part of the current path for connecting the other end of the circuit current line with the sense gate ground side terminal. A rewrite signal line is further provided for connecting the output terminal of the sense gate with the control terminal of the set gate. Thus when the persisting loop current within one of the superconducting memory loops is discharged into the read-out loop as differential current causing the sense gate to be switched to the voltage state by the application of a negative control current entering from its ground side terminal and exiting from its control terminal, at least a part of the sense current output from the output terminal of the sense gate at this time will be supplied to the control terminal of the set gate as rewrite command current.

The basic constitution of the present invention is as described above. When this basic structure is to be applied to the fabrication of an ordinary X-Y memory space, a plurality of the aforesaid memory cell columns are disposed in parallel in the row direction, each memory cell column is provided with one set gate and one sense gate in the manner described above, control signal lines for controlling the critical current values of the Josephson switches in the respective memory cells are disposed in parallel in a number equal to the number of memory cells in the individual memory cell columns so as to extend in the row direction as common word selection lines with respect to the memory cell groups constituted by the memory cells located at corresponding positions of the plurality of memory cell columns.

With the Josephson memory circuit constituted according to this invention, the equivalent of nondestructive read-out of the contents stored in the individual Josephson memory cells can be accomplished merely by appropriately setting the timing relationships for the gate circuit current, the gate control current and the control current for the Josephson switches in the Josephson memory loops (the X selection current or the word line current), as is normally required in the course of the design procedure. In other words, when the binary value stored in the Josephson memory cell selected in read mode at a given point in time is that represented by the presence of a persisting loop current (presumed here to be binary "1") and this persisting loop current is once discharged into the discharge loop constituting the read-out loop as a result of the binary "1" read operation, current is injected into the same loop for reestablishing the persisting loop current therein. Moreover, not only is it possible to read out binary "1" nondestructively in this manner but no residual current remains in the read-out loop following termination of the read mode.

These effects are realized as a result of the characterizing features of the invention, specifically the provision of a capacitance element connected in series within the read-out loop and the employment of a sense gate which is switched by a negative control current entering from its ground side terminal and exiting from its control terminal. With this arrangement, the current discharged into the read-out loop from the superconducting memory loop of the Josephson memory cell selected at any given moment during read mode operation becomes a current with a differential waveform which, after it has caused read-out of the binary value concerned by triggering operation of the negative-input sense gate, spontaneously dissipates within a time determined by the time constant of the circuit including the capacitance of the capacitance element. By its very principle of operation, therefore, the Josephson memory circuit according to the present invention has no need for a reset gate, a heat conversion resistor or any other such element conventionally required for eliminating residual current. Since there is no input or output of current to or from the ducting memory loop during a binary "0" read operation, it is obvious that this read-out is also conducted non-destructively.

A further advantage of the Josephson memory circuit according to the present invention is that the set gate and the negative-input sense gate provided for each memory cell column can both be disposed at the same end of the memory cell column, making it possible to use a line for supplying current from the sense gate output terminal to the set gate control terminal (a rewrite signal line) that is considerably shorter than that required in the conventional arrangement shown in FIG. 4.

Selective writing of binary "1" or "0" to the superconducting memory loop can be conducted in the same manner and in accordance with the same principle as in the conventional Josephson memory circuit discussed earlier, namely by selectively setting or not setting the set gate to the voltage state at the time of applying control current to the superconducting memory loop concerned. In this case again, differently from in the prior art memory, there is no danger of an indefinite current state arising in the read-out loop after termination of the write mode since when persisting loop current is injected into the selected superconducting memory loop for writing binary "1" therein, the circuit loop for the write operation is a separate loop from the aforesaid read-out loop.

The above and other features of the invention will become apparent from the following description made with reference to the drawings.

DESCRIPTION OF THE PREFERRED EMBODIMENT

Figure 1:
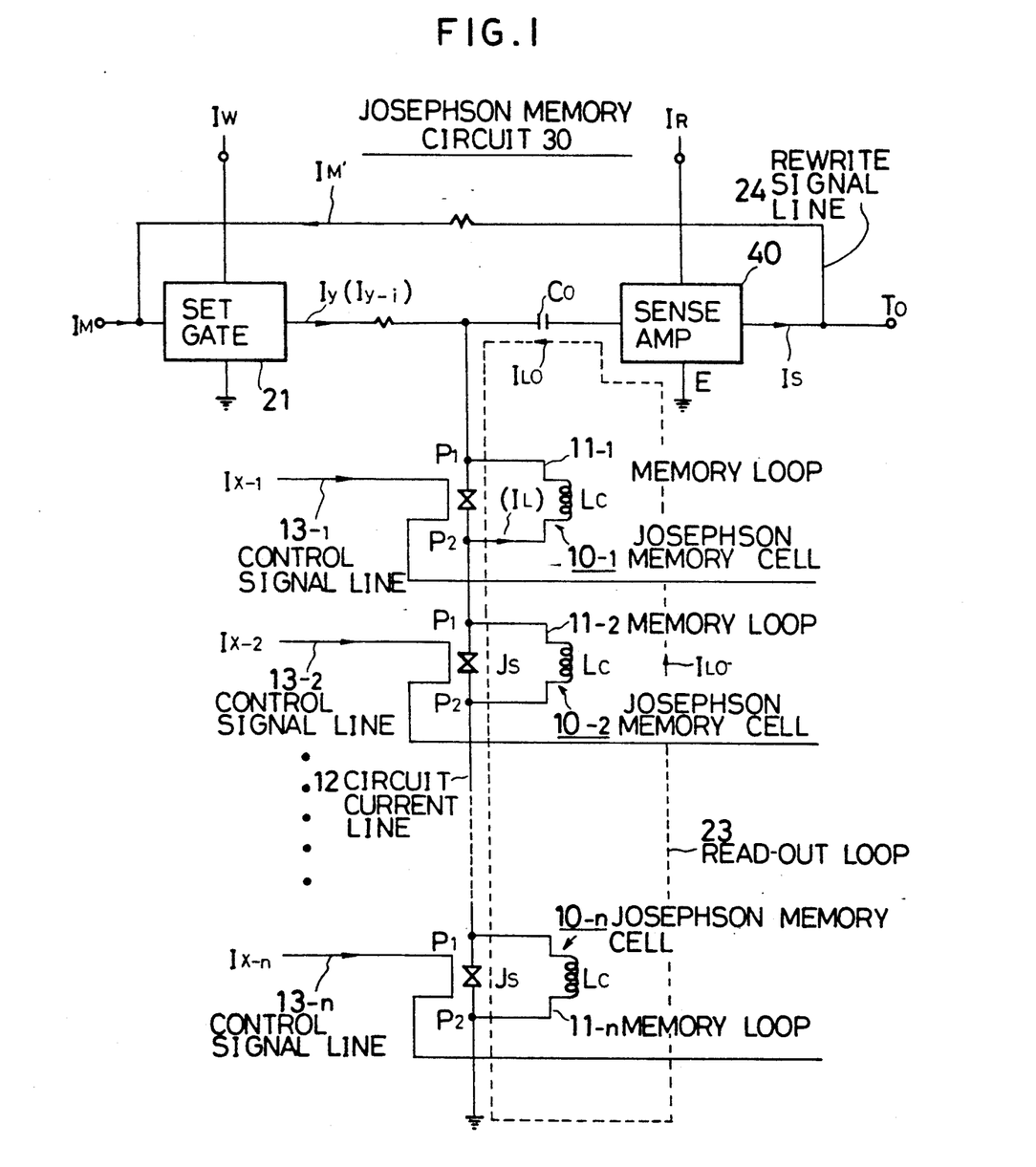
FIG. 1 is a schematic view of a unit memory cell column used in an embodiment of the Josephson memory circuit according to the present invention.

Reference numeral 30 in FIG. 1 designates a preferred embodiment of the Josephson memory circuit according to this invention. The components in the Josephson memory circuit according to the invention which are the same as or similar to those of the circuits described earlier with reference to FIGS. 3 and 4 are assigned the same reference symbols as in these figures. The superconducting memory cell column made capable of nondestructive read-out by the application of the present invention can be of substantially the same arrangement as the memory cell column described earlier as a typical example of such a column with reference to FIG. 3. This memory cell column comprises a plurality of flux quantum type Josephson memory cells 10 ($10_{-1}$-$10_{-n}$) that store the binary values "1" and "0" in terms of whether or not one or more flux quanta are captured in the superconducting memory loop thereof, i.e. in terms of whether or not a persisting loop current is present within the superconducting memory loop. The Josephson memory cells 10 are connected in series within a single circuit current line 12 to form the memory cell column and for obtaining a memory space constituted as an ordinary X-Y matrix, a plurality of such columns are disposed in parallel with each other in the row direction, as will be explained in more detail later. At this point the description will be limited to the single memory cell column shown in the drawing.

The individual Josephson memory cells 10 have the basic structure of an ac-SQUID. Each comprises a superconducting memory loop capable of selectively capturing at least a prescribed number of flux quanta. The superconducting memory loop 11 has thereon at least one Josephson switch $J_S$ whose critical current value is controlled by means of an external control current $I_Y$ applied to a magnetically coupled control signal line 13 and a pair of current injection terminals $P_1$, $P_2$ for connecting the superconducting memory loop 11 in series with the circuit current line 12. Depending on the moment-to-moment operating state of the cell, one of the current injection terminals $P_1$, $P_2$ is on the current inflow side and the other is on the current outflow side. Each of the Josephson switches $J_S$ within the superconducting memory loops 11 is constituted of discrete Josephson junctions magnetically coupled with the control signal line 13 and, specifically, these switches are most frequently constituted as dc-SQUIDs of the three-junction type or the like. From the viewpoint of either of the current injection terminals $P_1$, $P_2$, the superconducting memory loop 11 is divided into left and right branches. In the illustrated example, the Josephson switch $J_S$ is included in series connection within the left branch and an inductance $L_C$ is included in series connection within the right branch. While in fact the left branch can also be expected to include an inductance component, it is generally advantageous to establish a large difference between the inductance components of the two branches and, therefore, it is a common practice to ignore the inductance component of the branch including the Josephson switch $J_S$ when schematically representing a memory cell of this type using an ac-SQUID. In the interest of focusing the inductance at one point, therefore, only the inductance $L_C$ is shown in the drawing. It should be understood, however, that the illustrated Josephson memory cell 10 is presented merely as an example for demonstrating the principle of the invention and that practical Josephson memory circuits according to the invention are generally of more complex structure. As was mentioned earlier, the Josephson switches $J_S$ have a plurality of Josephson junctions. Moreover, there are cases in which such Josephson switching gates are provided at a plurality of points within the superconducting memory loops 11, in which inductance components are present at various locations and in which a damping resistance may, if required, be incorporated for suppressing resonance. The operating principle of such circuit arrangements can, however, also be explained with reference to the illustrated arrangement as an equivalent circuit. For example, if the circuit includes Josephson switches that are open/close controlled in conjunction with the writing or reading of binary values, these can be considered to be represented by the illustrated Josephson switches $J_S$. On the other hand, even if inductance components can be expected to arise at various locations, these can be considered as a composite inductance affecting the operation viewed from the exterior in terms of the superconducting memory loop 11 as a whole and, as such, can be collectively represented as the inductance $L_C$. Thus such cells can also be used in the present invention. That is to say, it is possible to employ any type of superconducting memory cell in the Josephson memory circuit according to the present invention insofar as it is a superconducting memory cell which, in accordance with the essential constituents prescribed by the invention, comprises a superconducting memory loop; a pair of current injection terminals provided on the superconducting memory loop; at least one Josephson switch provided in the superconducting memory loop whose critical current value is controllable by an external control current for selectively switching it between a zero voltage state in which the superconducting memory loop is closed and a voltage state in which the superconducting memory loop is open; and a control signal line for passage of the control current for critical current value control; the superconducting memory cell storing binary values in the form of the presence or absence of a persisting loop current flowing in the superconducting memory loop.

One end (the upper end in the drawing) of a circuit current line 12 connecting a plurality of the Josephson memory cells 10 is connected through a load resistor with the output terminal of a set gate 21, the control terminal of which can be selectively applied with a binary "1" write command current $I_M$. Here again the explanation will be made on the assumption that binary "1" is represented by the state in which a prescribed number of flux quanta are captured by the superconducting memory loop 11 and persisting loop current flows therein.

The control terminal of a sense amplifier 40 whose state switches upon application of a negative control current is series coupled through a capacitance element $C_O$ with the same (upper) end of the circuit current line 12 that is connected with the output terminal of the set gate 21. While the sense amplifier 40 might be called a sense gate, the term "sense amplifier" is used in this specification in view of the high current amplification factor this device is desired to have. The output of the sense amplifier 40 is forwarded to an output terminal $T_O$ for supplying sense current $I_S$ representing the result of the read-out from the Josephson memory circuit 30 to an external circuit (not shown). The output terminal $T_O$ is also connected with the control terminal of the set gate 21 through a rewrite signal line 24. As the set gate 21, it suffices to use an ordinary positive-input Josephson switching gate, by which is meant one which switches to the voltage state and produces an output current when a control current passes into it. It can thus be appropriately selected from among prior art Josephson switching gates of, for example, the dc-SQUID type or the current injection type. It is particularly preferable to select the current injection type four-junction closed-loop Josephson switching gate disclosed in the assignee's Japanese Patent Public Disclosures 56(1981)-32830 and 57(1982)-99034 and now widely known to those in this field as the 4JL type. The advantage of this switching gate is that it provides an adequate current gain (high input sensitivity) notwithstanding its simple structure. Regardless of whether this or some other type of Josephson switching gate is used for the set gate 21 of the present invention, it is necessary, notwithstanding that the set gate 21 is shown as a single block in FIG. 1, to be able to express the same in the circuit diagram as a four-terminal circuit including a terminal for receiving the circuit current serving as the gate power source, a terminal for connection to ground, a terminal for receiving control current and an output terminal for forwarding an output current to an exterior circuit when control current is received.

Figure 2:
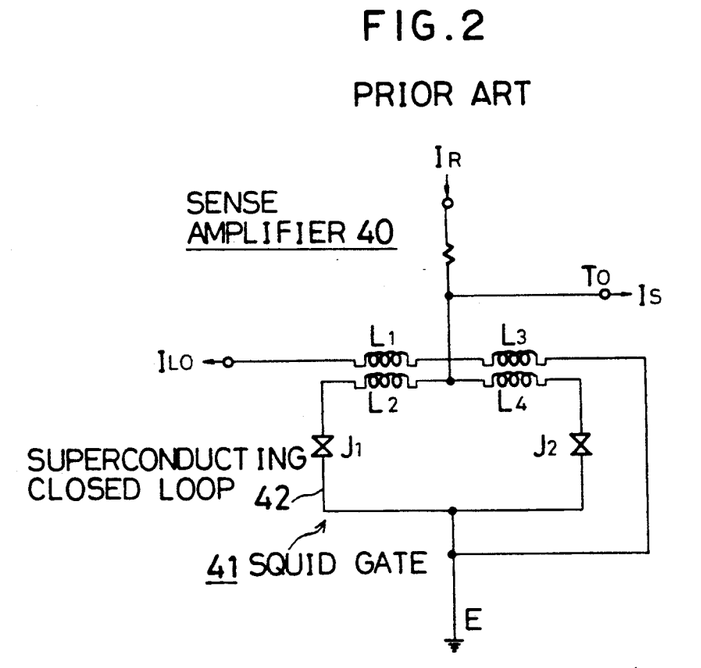
FIG. 2 is a schematic view of a conventional two-junction SQUID gate shown as one example of a circuit usable as the negative-input sense amplifier in the present invention.

It is also necessary to be able to express the sense amplifier 40 in the circuit diagram as a circuit with four terminals. It is further required, however, that the sense amplifier 40 used in the present invention be capable of being operated by negative control input. Specifically, it is necessary for the sense amplifier 40 to be capable of switching from the zero voltage state to the voltage state and outputting an output current (sense current) from its output terminal when a current enters from its ground side terminal, passes through its internal superconducting path (not shown) and exits from its control terminal. In addition, it should preferably have not less than a prescribed degree of current gain and, from the practical viewpoint, the closer its input impedance is to zero the better, since a low input impedance helps to suppress loss of the binary "1" read-out current (to be explained later) that is selectively passed into the read-out loop 23. The two-junction SQUID gate and three-junction SQUID gate can be mentioned as simply configured conventional circuits appropriate for use as the negative-input sense amplifier 40. The basic structure of the two-junction SQUID gate is shown in the equivalent circuit of FIG. 2.

The circuit comprises a superconducting closed loop 42 provided with a pair of gate current injection terminals. The one of these that is connected to the ground E side can be referred to as the "ground side terminal" and the other as the "circuit current terminal." The branch lines separating to the left and right of the pair of current injection terminals respectively include Josephson switches $J_1$, $J_2$ and inductance components $L_2$, $L_4$ in series with the Josephson switches $J_1$, $J_2$. Inductance components $L_1$, $L_3$ provided in a control current line for passing control current are magnetically coupled with the inductance components $L_2$, $L_4$. With this arrangement, if at the time power source circuit current $I_R$ is being supplied to the superconducting closed loop 42 a control current $I_{LO}$ is applied to the control current line to enter from ground E, pass through the inductance components $L_3$, $L_1$ and exit in the direction of the arrow, the Josephson switches $J_1$, $J_2$ will switch to the voltage state and, as a result, the circuit current $I_R$ that had up to then been passing to ground through the superconducting closed loop 42 will be diverted through the output terminal $T_O$ to the exterior as output current $I_S$. When this type of two-junction SQUID gate 41 is adopted as the sense amplifier 40 in the present invention, the reference symbols used in the foregoing description for identifying the circuit current, the control current and the output current correspond to those used in FIG. 1. Specifically, the control current $I_{LO}$ in FIG. 2 corresponds to the discharge current $I_{LO}$ resulting from discharge of persisting loop current $I_L$ into the read-out loop during the operation of the memory circuit of FIG. 1 to be explained later, the gate output current $I_S$ in FIG. 2 corresponds to the sense current $I_S$ in FIG. 1, and the circuit current $I_R$ in FIG. 2 corresponds to the circuit current $I_R$ in FIG. 1. As will become clear later, the current $I_R$ can also be called "read mode command current $I_R$." One feature that makes such a two-junction SQUID gate 41 preferable in actual applications for use as the negative-input sense amplifier 40 required by the present invention is that, irrespective of whether or not there is any need to rewire the opposite ends of the control current line with respect to the power source and ground or to carry out modifications or changes, it remains possible by a simple means such as by making design changes in the impedance coupling portion to realize a positive-input device or a negative-input device starting from the same circuit configuration. Another feature that makes it preferable is that it enables the required current gain to be obtained. It also has an adequately low input impedance. The invention is, however, not limited to the use of a two-junction SQUID gate. A three-junction device is able to provide the same functions as described above and, moreover, even where the circuit configuration includes a current-injection type 4JL switching gate, although differently from the case of using a two-junction SQUID of the type shown in FIG. 2 it is not possible to use a single stage gate, it is possible to configure a switching circuit usable as the sense amplifier 40 of the present invention.

One feature characterizing the circuit according to the invention shown in FIG. 1 is that the ground plane ordinarily provided on the substrate of a Josephson circuit of this type is effectively utilized for connection between the other end of the circuit current line 12 and the ground side terminal E of the sense amplifier 40. In other words, as can be seen from the embodiment under discussion, the invention is able, without special provision of a separate line, to establish a current loop 23 (indicated by a broken line in the drawing) extending from the other end of the circuit current line 12 through the ground plane to the ground side terminal of the sense amplifier 40, from the ground side terminal of the sense amplifier 40 through the control signal line constituted by the superconducting path inside the gate, and then through the capacitance element $C_O$ to the upper end of the circuit current line 12. This loop 23 serves as a read-out loop 23 to be explained below.

Writing and reading of binary values to and from the Josephson memory circuit 30 constituted in the aforesaid manner in accordance with this invention can be conducted by the following procedures, for example. First the write mode procedure when binary "1" is to be written to a selected Josephson memory cell 10 or the superconducting memory loop 11 thereof will be explained. Under application of power source current (gate current) $I_W$ to the set gate 21, binary "1" write command current $I_M$ constituting gate control current is applied to the set gate 21 so as to cause the set gate 21 to switch to the voltage state and produce output current $I_Y$ which, passing from one end of the circuit current line 12 to ground, serves as circuit current $I_Y$. Concurrently, control current or X selection control current $I_X$ is applied to the control signal line 13 of the particular superconducting memory cell selected for write-in from among the plurality of Josephson memory cells $10_{-1}$-$10_n$ connected in series by the circuit current line 12. Since this causes the Josephson switch $J_S$ of the selected Josephson memory cell 10 (and only this Josephson switch) to be switched to the voltage state, the application of the control current $I_X$ is first discontinued and then the power source current $I_W$ to the set gate 21 and the circuit current $I_Y$ are raised to high level, whereby the Josephson memory cell 10 captures a number of flux quanta corresponding to the magnitude of the injection current. Thus, a persisting loop current $I_L$ is produced in the superconducting memory loop 11 of the selected Josephson memory cell 10 and the writing of binary "1" thereto is completed. (By way of example, this is indicated by the presence of the symbol ($I_L$) inside the superconducting memory loop $11_{-1}$ of the Josephson memory cell $10_{-1}$ in FIG. 1.) This binary "1" write operation is not affected by the binary content of the Josephson memory cell 10 prior to the start of the operation. Assume, for instance, that the previously stored value was binary "1", namely that a persisting loop current $I_L$ was present in the superconducting memory loop 11. Since the Josephson switch $J_S$ of the memory loop concerned is once switched to the voltage state by the application of the circuit current $I_Y$ and control current $I_X$ in the course of the above-described operation, this earlier existing persisting loop current $I_L$ will be discharged into the current discharge loop or read-out loop 23 (to be explained later) and thus the previous binary content of the memory loop will in effect be erased. Following this, the persisting loop current $I_L$ is once again written to the superconducting memory loop in the current write operation. The current $I_{LO}$ discharged to the read-out loop 23 from the selected superconducting memory loop 11 at the time of this erasure of the earlier stored binary content passes from the ground side terminal, out through the control terminal of the sense amplifier 40 and through the capacitance element $C_O$ to become a circulating differential current which dissipates within a time period determined by the differential time constant of the circuit. However, since the sense amplifier 40 is not supplied with power source current $I_R$ and is therefore not activated in the write mode, the control line current path within the sense amplifier 40 merely acts as a superconducting path for passage of the discharge current $I_{LO}$.

Binary "0" is written by applying the control current $I_X$ to the selected cell of the Josephson memory cell 10 without applying binary "1" write command current $I_M$ to the set gate 21. When this write operation is made to a Josephson memory cell 10 currently storing binary "0", since no change in state is caused in write mode by the application of only the control current $I_X$, the state of absence of a significant current continues in the superconducting memory loop 11 of the Josephson memory cell after the supply of control current $I_X$ is discontinued, whereby binary "0" is freshly stored in cell concerned. When the write operation is made to a Josephson memory cell 10 currently storing binary "1", rewriting to binary "0" occurs automatically with the application of the control current $I_X$. Specifically, when the control current $I_X$ is applied to a Josephson memory cell 10 having a persisting loop current $I_L$ flowing in its superconducting memory loop 11, the Josephson switch $J_S$ of the superconducting memory loop 11 is temporarily opened by a so-called vortex transient induced by the combined effect of the control current $I_X$ and the persisting loop current $I_L$, even if the circuit current $I_Y$ is not supplied to the superconducting memory loop 11. As a result, the persisting loop current $I_L$ is discharged into the read-out loop 23 and since the Josephson switch $J_S$ then closes again, no significant current remains in the superconducting memory loop after the supply of the control current $I_X$ is discontinued, i.e. after the write mode is terminated. The effect is thus that of rewriting binary "1" to binary "0".

The nondestructive read-out operation which is a characterizing feature of this invention will now be explained. In read mode, the sense amplifier 40 is first activated by supplying it with power source current (gate current) $I_R$ and then the superconducting memory loop $11_{-j}$ of the Josephson memory cell $10_{-j}$ which is the one among the plurality of superconducting memory loops $11_{-1}-11_{-n}$ connected in series by the circuit current line 12 that is to be read is applied with control current or X selection current $I_X$. (From this point on, the description will be continued without including the suffixes.) Assume that the selected Josephson memory cell 10 is storing binary "1" and that, therefore, a persisting loop current $I_L$ is present in the superconducting memory loop 11 thereof. The magnitude of the persisting loop current $I_L$ in the superconducting memory loop 11 when k flux quanta are captured therein can be calculated from the equation $$L_C I_L \approx k\Phi_o \quad (1)$$

where $\Phi_o$ represents a single flux quantum, $L_C$ is, as explained earlier and shown in the drawing, the inductance of the superconducting memory loop 11. However, when the application of X selection current $I_X$ in the read mode causes the critical current value of the Josephson switch $J_S$ controlled thereby to fall to a level that makes it impossible to capture even a single flux quantum, the Josephson switch $J_S$ switches to the voltage state and, as a result, the persisting loop current $I_L$ present in the superconducting memory loop 11 is discharged to the superconducting read-out loop 23 as explained earlier. Where the equivalent impedance of the superconducting memory loops other than the one from which the persisting loop current was discharged and the series inductance of the superconducting read-out loop 23 are collectively defined as equivalent inductance $L_B$, the magnitude of the discharge current $I_{LO}$, namely the binary "1" read-out current $I_{LO}$ caused to pass into the superconducting read-out loop 23, can, in view of the fact that the relationship between the equivalent inductance $L_B$ and the inductance $L_C$ of the superconducting memory loop is generally $L_B >> L_C$, be approximately expressed as $$I_{LO} = \frac{k\Phi_o}{L_B + L_C} \approx \frac{L_C}{L_B} I_L \quad (2)$$

Strictly speaking, the foregoing explanation relates to the magnitude of the superconducting current $I_{LO}$ able to flow constantly in a read-out loop which, like that in the prior art arrangement shown in FIG. 4, does not include a capacitance element and in the case of the present invention the presence of the capacitance element $C_O$ series coupled within the read-out loop 23 causes differentiation of the discharge current $I_{LO}$. Notwithstanding, it will be understood from the explanation that the present invention is able to produce a binary "1" read-out current $I_{LO}$ discharged into the read-out loop 23 of the selected superconducting memory loop 11 that is of an adequate magnitude and pulse width insofar as the superconducting memory loop 11 is made to capture at least a prescribed number of flux quanta and the magnitude of the capacitance element $C_O$ is set at not less than a prescribed value. Although the binary "1" read-out current $I_{LO}$ exhibits a differential waveform it nevertheless constitutes a regular negative control input current $I_{LO}$ with respect to the sense amplifier 40 when the sense amplifier 40 is activated during read mode operation. Thus in accordance with the operating principle explained in the foregoing, the sense amplifier 40 switches to the voltage state and a sense current $I_S$ representing binary "1" read-out is supplied to an external circuit (not shown) from the output terminal $T_O$ thereof. While this operation clearly constitutes destructive read-out, the present invention achieves the equivalent of nondestructive read-out by conducting a binary "1" rewrite operation to the same cell immediately following the output of the sense current $I_S$. This will now be explained. At least a part of the sense current $I_S$ output from the output terminal of the sense amplifier 40 is supplied through a rewrite signal line 24 to the input of the set gate 21 as rewrite command current $I_M'$. Therefore, if circuit current $I_W$ is supplied beforehand to the set gate 21 during the read mode operation under discussion, the arrival of the rewrite command current $I_M'$ will switch the set gate 21 to the voltage state, whereby circuit current $I_Y$ will be applied to the circuit current line 12. Thus if a timing relationship is established such that the X selection current $I_X$ for selecting the superconducting memory cell to be read is still present at this time, binary "1" will be rewritten to the same Josephson memory cell 10 or its superconducting memory loop 11 in the same manner as in the write mode explained earlier. The rewrite operation is again terminated by first discontinuing the supply of the X selection current $I_X$ and then discontinuing the supply of circuit current $I_Y$. The case where the content of the Josephson memory cell 10 selected in read mode is binary "0" will now be explained. Since in this case no persisting loop current $I_L$ is present in the superconducting memory loop 11, no sense current $I_S$ will be output from the output terminal $T_0$ of the sense amplifier 40 when X selection current $I_X$ is applied to the X selection signal line 13 concurrently with the application of power source current $I_R$ to the sense amplifier 40. Therefore, the external circuit will be able to sense that the content of the selected Josephson memory cell 10 is binary "0" from the fact that no sense current $I_S$ is produced by the sense amplifier 40 at the prescribed read-out time. Since the binary "0" read-out operation entails no injection or discharge of current to or from the superconducting memory loop 11, it is intrinsically a nondestructive read-out operation.

The foregoing description of the Josephson memory circuit 30 according to the invention was limited to a single unit memory column, i.e. to a one-bit line portion. A plurality of such circuits can, however, easily be fabricated into a memory space based on the ordinary X-Y matrix configuration. For this it is only necessary to dispose a plurality of the circuits shown in FIG. 1 in parallel with each other in the row direction such that the individual circuit current lines 12 of the arrangement serve as unit bit lines. In fabricating the matrix in this way, if the same number of Josephson memory cells 10 are included in each circuit current line or bit line $12_{-i}$ and each of the control signal lines $13_{-j}$ (j=1, 2, 3 ... n) shown in FIG. 1 is disposed so as to serve as a common X selection line for all memory cells at a given position in the columns, it becomes possible to carry out a word selection operation for simultaneous read-out of all memory cells associated with the control signal line $13_{-j}$. The control signal line $13_{-j}$ can be thought of as a word selection line. On the other hand, in carrying out write operations separately for each bit it is not possible to write binary "0" to only the bit superconducting memory cell for which binary "0" was selected in the earlier described manner simply by supplying control current $I_{X-j}$ to the X selection line or word selection line $13_{-j}$ associated with the cell concerned since this would cause any cells storing binary "1" among the superconducting memory loops 11 connected with this word selection line $13_{-j}$ to be rewritten to binary "0" as a result of the vortex transient principle referred to earlier. Thus where the X-Y matrix configuration is adopted in conjunction with the word selection line arrangement, write-in, particularly write-in of binary "0" should be conducted with the bit columns other than the selected bit column operating in the nondestructive read mode according to this invention.

As explained in the foregoing, the present invention is able to respond to market demand for nondestructive read-out capability by providing a circuit that, while not being directly capable of such read-out, is able to achieve the equivalent thereof by first conducting destructive read-out of binary "1" from a memory loop storing this value by causing the loop to discharge its persisting loop current and then immediately and automatically conducting a binary "1" rewrite operation with respect to the same loop. The invention moreover makes it possible to prevent the indefinite current state which, as was explained earlier with respect to the prior art circuit, tends to arise in the read-out loop 23 following the completion of a binary read operation. This is made possible by the fact that the presence of the capacitance element $C_O$ causes differential current to be present within the read-out loop and this differential current is without fail dissipated to zero level within a prescribed time period that is a function of the time constant determined by the capacitance of the capacitance element $C_O$. The circuit according to the invention therefor has no need for the reset gate, resistance or the like that were virtually indispensable in the prior art circuit shown in FIG. 4. Another advantage of the invention is that the set gate 21 and the sense amplifier 40 need to be electrically connected with only one end of the circuit current line 12 of the memory cell column. This makes it possible to substantially shorten the length of the rewrite signal line 24 connected between the output terminal of the sense amplifier 40 and the control terminal of the set gate 21 and to provide the same in a manner not cutting across the memory space.

The capacitance element $C_O$ need only be able to provide the prescribed amount of capacitance. There are no restrictions on its structure. It can, for example, be of the conventional type in which a pair of electrodes are disposed across a thin dielectric film. Alternatively, so long as the semiconductor circuit system and the superconducting circuit system can coexist on the same chip, it can be constituted using the depletion layer of a diode. As was explained earlier, the magnitude of the capacitance of the capacitance element $C_O$ need only be sufficient for ensuring that the magnitude and pulse width of the differential discharge current $I_{LO}$ discharged into the read-out loop 23 during read-out mode operation are adequate for enabling detection by the sense amplifier 40. Fortunately, the magnitude required for this is generally not very large in actual applications and often need not be greater than the picofarad order coupling capacitance possessed by ordinary Josephson junction circuits. The reason for this is that the switching gates of the earlier discussed two-junction SQUID and other such Josephson circuits are characterized by high speed operation capability and also provide a certain degree of current gain or input sensitivity s that the sense amplifier 40 is able to respond adequately even to a differential discharge current (negative input control current) $I_{LO}$ that is quite sharp. The power source currents $I_W$ and $I_R$, the binary "1" write command current $I_M$, the X selection current (word selection current) $I_X$ and the like can be obtained from unipolar pulse sources between which prescribed phase and duty relationships have been established.

What is claimed is:

1. A Josephson memory circuit comprising:
   one or more superconducting memory cells each having a superconducting memory loop, a pair of current injection terminals provided on the superconducting memory loop, at least one Josephson switch provided in the superconducting memory loop whose critical current value is controllable by an external control current for selectively switching it between a zero voltage state in which the superconducting memory loop is closed and a voltage state in which the superconducting memory loop is open and a control signal line for passage of the control current, the superconducting memory cell storing binary values in the form of the presence or absence of a persisting loop current flowing in the superconducting memory loop,
   a circuit current line connecting said one or more superconducting memory cells in series via said pairs of current injection terminals to constitute a memory cell column,
   a set gate which upon application to a control terminal thereof of a write command current indicative of the binary value represented by the presence of a persisting loop current in the memory loop switches itself to the voltage state and from an output terminal thereof outputs a circuit current to one end of the circuit current line,
   a sense gate having a control terminal series coupled through a capacitance element with one end of the circuit current line, a ground side terminal connected with another end of the circuit current line and a superconducting path between the control terminal and the ground terminal,
   a read-out loop for receiving as differential current persisting loop current selectively discharged from the memory loop being formed in zero voltage state of the sense gate by shorting of the opposite ends of the circuit current line through a current path including a series circuit segment constituted by the capacitance element and the superconducting path between the control terminal and the ground side terminal, and the sense gate switching to the voltage state and outputting a sense current from an output terminal thereof when differential current is present in the read-out loop and is applied as negative control current passing from the ground side terminal to the control terminal, and
   a rewrite signal line connecting the output terminal of the sense gate and the control terminal of the set gate for supplying at least a part of the sense current to the control terminal of the set gate as rewrite command current.

2. A Josephson memory circuit according to claim 1, further comprising:
   a plurality of the memory cell columns disposed in parallel in the row direction and each provided with a set gate, a sense gate and the same number of memory cells,
   each of the control signal lines for controlling the critical current values of the Josephson switches in the respective memory cells being disposed to serve as a common word selection line for all memory cells at a given position in the columns.

3. A Josephson memory circuit according to claim 1 wherein,
   the set gate is constituted as a current injection type Josephson switching gate.

4. A Josephson memory circuit according to claim 1 wherein,
   the set gate is constituted as a SQUID type Josephson switching gate.

5. A Josephson memory circuit according to claim 1 wherein,
   the sense gate is constituted as a SQUID type Josephson switching gate.

6. A Josephson memory circuit according to claim 1 wherein,
   the sense gate is constituted as a two-junction SQUID type Josephson switching gate.

7. A Josephson memory circuit according to claim 1 wherein,
   the sense gate is constituted as a three-junction SQUID type Josephson switching gate.

8. A Josephson memory circuit according to claim 1 wherein,
   the connection between the other end of the circuit current line and the ground side terminal of the sense gate is constituted by a ground plane.

9. A Josephson memory circuit according to claim 1 wherein,
   the Josephson switch in the superconducting memory cell is constituted of discrete Josephson junctions.

10. A Josephson memory circuit according to claim 1 wherein,
    the Josephson switch in the superconducting memory cell is a dc-SQUID.

11. A Josephson memory circuit according to claim 10 wherein,
    the dc-SQUID is of three-junction type.

* * * * *